United States Patent [19]
Choi

[11] Patent Number: 5,485,015
[45] Date of Patent: Jan. 16, 1996

[54] QUANTUM GRID INFRARED PHOTODETECTOR

[75] Inventor: Kwong-Kit Choi, Tinton Falls, N.J.

[73] Assignee: The United States of America as represented by the Secretary of the Army, Washington, D.C.

[21] Appl. No.: 297,344

[22] Filed: Aug. 25, 1994

[51] Int. Cl.[6] ............... H01L 31/0236; H01L 31/109
[52] U.S. Cl. ............... 257/21; 257/184; 257/436; 257/432; 359/575
[58] Field of Search ............... 257/21, 184, 432, 257/436, 448; 359/574, 575

[56] References Cited

U.S. PATENT DOCUMENTS

| | | | |
|---|---|---|---|
| 4,729,640 | 3/1988 | Sakata | 359/570 |
| 5,056,889 | 10/1991 | Morgan | 359/570 |
| 5,075,749 | 12/1991 | Chi et al. | 257/21 |

FOREIGN PATENT DOCUMENTS 0508970  10/1992  European Pat. Off. ............... 257/21

OTHER PUBLICATIONS

Lundqvist, L., et al., "Efficiency of grating coupled AlGaAs/GaAs quantum well infrared detectors." Appl. Phys. Lett. 63 (24), (13 Dec. 1993), pp. 3361–3363.

*Primary Examiner*—Jerome Jackson
*Attorney, Agent, or Firm*—Michael Zelenka; William H. Anderson

[57] ABSTRACT

A quantum grid infrared photodetector (QGIP) includes a semiconductor substrate with a quantum well infrared photodetector (QWIP) mounted thereon. The QWIP includes a lower contact layer formed on a planar surface of the substrate and a stack of alternate planar barrier layers and planar well layers sandwiched between the lower contact layer and an upper contact layer. The planes of the barrier layers and well layers are substantially parallel to the plane of the planar surface. A plurality of single-slit diffraction units are arranged as a grid in the stack for diffracting incident infrared radiation into a continuum of radiation components directed toward the well layers at different angles with respect to the planes of the well layers. The diffraction units are composed of cavities that extend through the barrier layers, the well layers and the upper contact layer. The cavities have rectangular, square and round shapes and are arranged in rows and columns to form the grid.

23 Claims, 6 Drawing Sheets

QUANTUM GRID INFRARED PHOTODETECTOR

GOVERNMENT INTEREST

The invention described herein may be manufactured, used and licensed by or for the Government for governmental purposes without the payment to me of any royalties thereon.

BACKGROUND OF THE INVENTION

1. Field of the Invention

This invention relates in general to the field of infrared (IR) image detection. More particularly, the invention relates to a quantum grid infrared photodetector having means for enhancing the direction of propagation of incident IR radiation.

2. Description of the Prior Art

A quantum well IR photodetector (QWIP) is a superlattice semiconductor device which functions to produce intersubband transitions within a conduction band when a ground state electron is promoted to an excited state upon absorbing an incoming photon having energy equal to the subband spacing. Once in the excited state, the electron freely moves within the QWIP to form a photocurrent under electrical bias. As such, QWIP's are often used to detect IR radiation. QWIP arrays have been used to detect IR images.

The physical construction of a conventional QWIP generally includes a stack of alternate semiconductor material layers sandwiched between two contact layers. The layers are grown on a transparent semiconductor substrate and cover an area that is relatively broad in comparison to the layer thicknesses. A typical semiconductor material system suitable for QWIP fabrication is $GaAs/Al_xGa_{1-x}As$.

In a conventional QWIP of the type just described, intersubband optical transitions can be initiated only if a component of the electric field vector of the incident IR radiation is normal to the broad surface areas of the semiconductor layers in the stack. Consequently, IR radiation that is incident normal to the semiconductor layers cannot be absorbed by the QWIP. Because only IR radiation having components directed parallel to the semiconductor layers can be absorbed by the QWIP, attempts have been made to provide structures that can redirect the incident IR radiation closer to the desired parallel direction.

One prior art technique for redirecting IR radiation in a QWIP uses a grating coupling technique. The efficiency of a grating coupled QWIP is discussed in the following published article: Lundqvist et al., "Efficiency of grating coupled AlGaAs/GaAs quantum well infrared detectors," *Applied Physics Letters*, vol. 63 (24), 13 Dec. 1993, pp 3361–3363.

In a typical grating coupled QWIP, grooves are etched into the upper contact layer and a continuous metal contact is then deposited on the upper surface to form an optical grating that diffracts non-parallel incident radiation into different discrete directions. In general, such diffracted radiation will have a finite electric field component that is perpendicular to the broad layer surfaces, causing some of the IR radiation to be absorbed. Although this diffraction grating technique for coupling IR radiation into a QWIP has been used successfully in making two-dimensional IR detector arrays, it has several drawbacks. First, in order to make an efficient diffraction grating, extra thick contact layers (e.g., 2.5 microns or greater) have to be grown, which can be costly. Also, detector quantum efficiency can be appreciably reduced because extra radiation absorption, which does not contribute to photocurrent, takes place in the highly doped contact layer which helps form the grating.

Second, plasma etching of the contact layer to form the grating often causes material damage to layers underneath the grating. The damaged regions, often having thicknesses up to 1.5 microns, may be highly conductive, causing a number of detector semiconductor layers to be shorted out. Since only the remaining undamaged layers are still active, the sensitivity of the detector is reduced.

Third, in grating coupling, the partially absorbed light can be internally refracted by a substrate-air interface into different detector pixels of a detector array. This radiation can cause appreciable crosstalk between the different detector pixels.

Fourth, the diffraction of light by a grating is effective only when the overall grating dimension is much larger than the groove spacing. However, in a high-resolution detector array, the number of grooves at each pixel is usually small, which reduces the grating efficiency. In order to avoid this problem and to enhance the absorption within the same detector pixel, the substrate can be thinned by polishing. However, to make the thinning effective, the substrate has to be thinned to only a few microns thick, making the whole detector array extremely fragile.

Fifth, because radiation having only a narrow range of wavelengths is diffracted to a proper angle for each grating periodicity, a grating coupler cannot be used to couple a wide range of radiation with different wavelengths and, hence, limits the spectral response of a QWIP. Therefore, manufactures have to design a specific grating structure for each different detector. Also for the same reason, grating coupling cannot be used effectively for multi-color detection.

SUMMARY OF THE INVENTION

Broadly, the general purpose of this invention is to provide an infrared photodetector formed from a quantum well infrared photodetector with single-slit diffraction units to enhance the direction of propogation of incident IR radiation. The quantum well infrared photodetector has a stack of alternate planar barrier layers and planar well layers sandwiched between contact layers. The photodetector is grown on a semiconductor substrate with the planes of the barrier layers and the well layers substantially parallel to the surface of the substrate. A single-slit diffraction means is formed in the stack for diffracting incident infrared radiation into a continuum of radiation components directed toward the well layers at different angles with respect to the planes of the well layers.

More specifically, the invention includes a quantum grid infrared photodetector (QGIP) having a semiconductor substrate with a quantum well infrared photodetector (QWIP) mounted thereon. The QWIP includes a lower contact layer formed on a planar surface of the substrate and a stack of alternate planar barrier layers and planar well layers sandwiched between the lower contact layer and an upper contact layer. The planes of the barrier layers and well layers are substantially parallel to the plane of the planar surface. A plurality of single-slit diffraction units are arranged as a grid in the stack for diffracting incident infrared radiation into a continuum of radiation components directed toward the well layers at different angles with respect to the planes of the well layers. The diffraction units are composed of cavities that extend through the barrier layers, the well layers and the upper contact layer. The cavities have rectangular, square and round shapes and are arranged in rows and columns to form the grid.

The exact nature of this invention and advantages thereof will be readily apparent from consideration of the following specification relating to the annexed drawings wherein like reference numerals correspond to like parts throughout the several views.

DETAILED DESCRIPTION OF THE PREFERRED EMBODIMENTS

Figure 1:
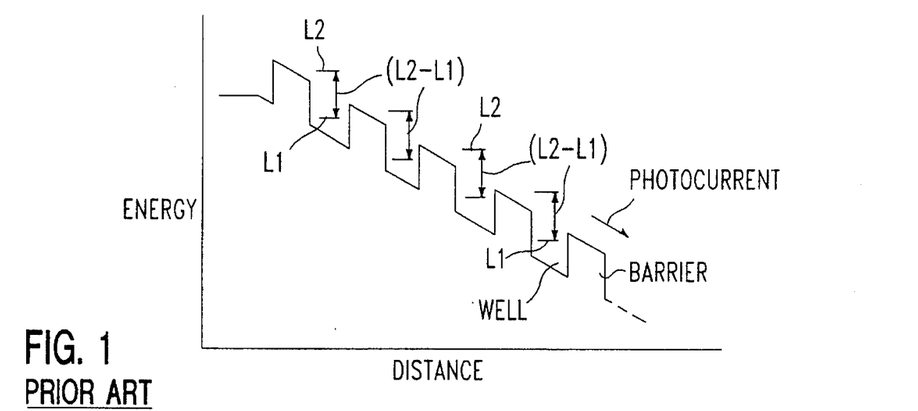
FIG. 1 is an energy level diagram useful in understanding the present invention.

Referring now to the drawings, FIG. 1 shows an energy band structure for a portion of a conventional QWIP that is under bias. The FIG. 1 energy band structure comprises a series of alternate potential barriers and quantum wells with each well having a ground state level L1 located within the well and a first excited state level L2 located above or near the top of an adjacent barrier when under bias. When an electron that is initially located in ground state level L1 absorbs an incoming photon of energy equal to the subband spacing (L2-L1), the electron is promoted to the first excited state level L2. Once in level L2, the electron is free to move within the QWIP and form a photocurrent under electrical bias.

Figure 2:
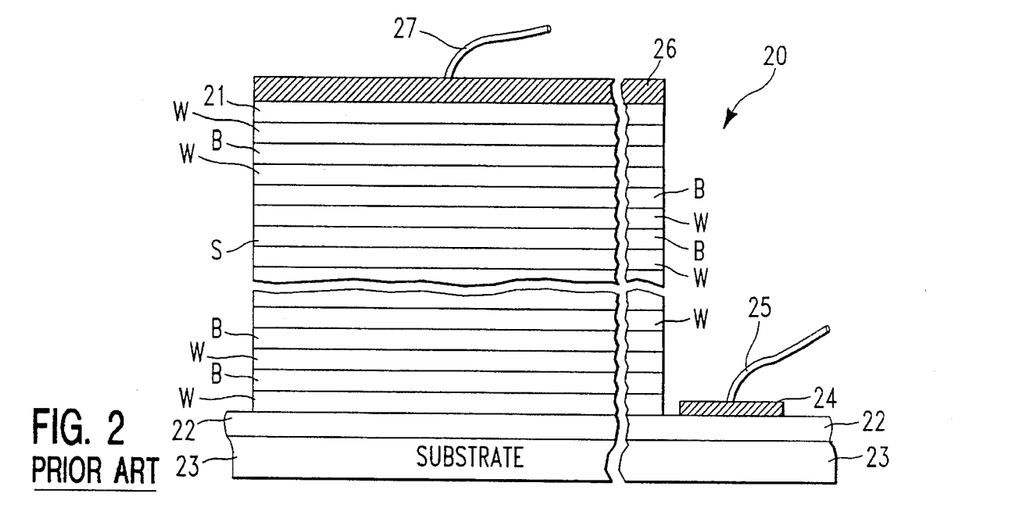
FIG. 2 is an enlarged schematic cross section in elevation of a prior art quantum well infrared photodetector (QWIP) useful in understanding the present invention.

FIG. 2 schematically depicts the physical construction of QWIP 20, which comprises stack S of alternate semiconductor material barrier layers B and well layers W sandwiched between two contact layers 21 and 22. Lower contact layer 22, which is formed on transparent substrate 23, supports metal contact 24 which connects to electrical conductor 25. Upper contact layer 21 supports metal contact 26 which connects to electrical conductor 27. A typical material system for QWIP 220 is $GaAs/Al_xGa_{1-x}As$. Using this material system as an example, the composition of the semiconductor layers is as follows: substrate 23 is formed from undoped Gallium Arsenide (GaAs); quantum well layers W are formed from doped GaAs; contact layers 21 and 22 are formed from highly doped GaAs; and barrier layers B are formed from undoped Aluminum Gallium Arsenide (AlGaAs).

Figure 3:
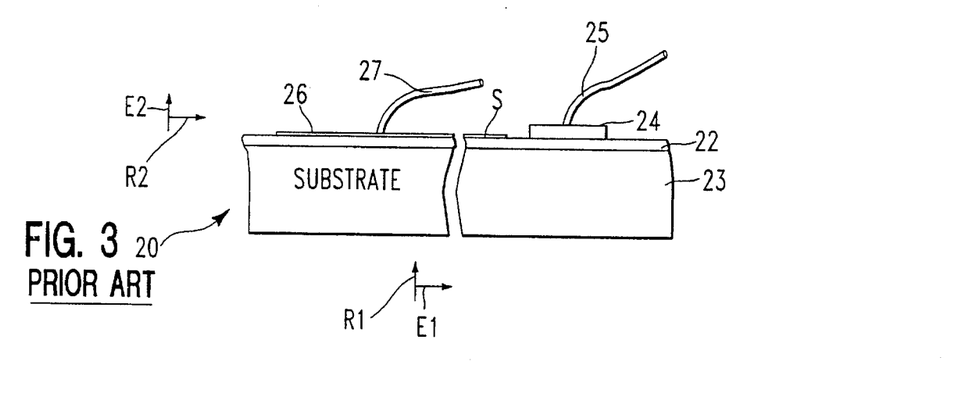
FIG. 3 is a schematic representation in elevation of the prior art apparatus of FIG. 2 illustrating the relative sizes of the elements thereof.

FIG. 2, which is not drawn to scale, shows stack S to be much thicker than substrate 23. However, substrate 23 would normally be very thick in comparison to stack S. FIG. 3 more realistically shows stack S having relatively broad horizontal dimensions in a plane parallel to the upper surface of substrate 23 and a relatively thin vertical height. It is also noted that the view of FIG. 2 is schematic and in cross section; however, for simplicity and clarity, only metal contacts 25 and 26 are cross hatched. This approach will be employed in other cross sectional views throughout the drawings.

FIGS. 2 and 3 show substrate 23 as having broken ends to illustrate that each QWIP 20 generally forms a single IR detector as part of a two-dimensional detector array made up of a number of similar QWIP's 20 located on the upper surface of lower contact layer 22 and substrate 23. When a two-dimensional array of QWIP's 20 are used to detect IR images, the detector array locates each QWIP 20 at a different pixel location.

FIG. 3 also depicts the propagation of incident IR radiation in two orthogonal directions. Specifically, incident IR radiation R1 is shown directed normal to the broad surface of stack S while incident IR radiation R2 is directed parallel to the broad surface of stack S. The corresponding electric field vectors E1 and E2 associated with IR radiation R1 and R2, respectively, point normal to the direction of propagation of the radiation. Also, the FIG. 3 example assumes that radiation R1 and R2 are each polarized such that their electric field vectors E1 and E2 lie in the plane of FIG. 3.

As is well known in the art, intersubband optical transitions in well layers W of stack S can be initiated only if the electric field vector (or a component of the electric field vector) associated with the incident radiation points normal to the plane of well layers W. Consequently, incident IR radiation R2, with its electric field vector E2 directed normal to the plane of the broad surface of stack S, will be absorbed by QWIP 20. However, because the total electric field vector E1 of incident radiation R1 has no field component that is perpendicular to well layers W, radiation R1 will not be absorbed. In order to increase the amount of radiation absorption in prior art QWIP's, designers have included means for redirecting the propagation direction of incident IR radiation that is not parallel to the plane of well layers W, such as radiation R1, into directions that are closer to the desired parallel direction.

Figure 4:
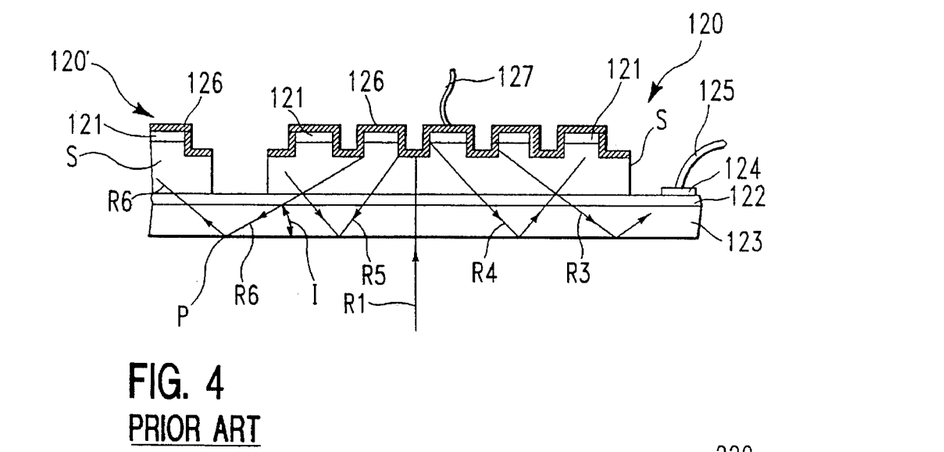
FIG. 4 is an enlarged schematic cross section in elevation of a modified prior art QWIP useful in understanding the present invention.

FIG. 4 illustrates a prior art technique for redirecting incident radiation in a two-dimensional array of QWIP's. FIG. 4 illustratively depicts QWIP 120 and part of an adjacent QWIP 120' which are located at different pixels of a two-dimensional array mounted on a common lower contact layer 122 and substrate 123. As seen in FIG. 4, QWIP's 120 and 120' have a common metal contact 124 connected to a conductor 125. Also, each of QWIP's 120 and 120' has an upper metal contact 126 which is grooved to form optical diffraction gratings which diffract non-parallel incident radiation into a limited number of discrete components that are closer to the plane of well layers W. For clarity of illustration, the barrier layers B and well layers W of stack S are not shown in FIG. 4. Fabrication of QWIP's 120 and 120' typically involves etching appropriately sized grooves into the upper contact layer 121 and a few of the upper barrier layers B and well layers W of conventional QWIP 20 of FIG. 2 prior to application of continuous metal contact 126.

FIG. 4 illustrates upper metal contacts 126 acting as optical diffraction gratings to redirect non-parallel incident IR, such as normal incident radiation R1, to produce diffracted radiation components, such as components R3, R4, R5 and R6, which propagate along discrete lines that are closer to the plane of well layers W. Since diffracted radiation components R3–R6 have, in general, finite electric field components that will be normal to the plane of well layers W, some of the radiation associated with components R3–R6 will be absorbed by well layers W. It is noted that radiation components R3–R6 will have finite electric field components normal to the plane of well layers W only if incident radiation R1 has a finite electric field component in the plane of FIG. 4. If normal incident radiation R1 is polarized such that its electric field is normal to the plane of FIG. 4, the electric field of the deflected components R3–R6 will still be normal to the plane of FIG. 4 and, therefore, parallel to the desired plane of well layers W, in which case no radiation absorption will take place.

As indicated above, the diffraction grating technique for coupling radiation into a two-dimensional array of QWIP's has several disadvantages. For example, in order to make an efficient diffraction grating, extra thick contact layers 121 have to be grown, which can be costly. This extra thickness also causes extra radiation absorption in highly doped contact layers 121 which does not contribute to photocurrent and, hence, reduces the detector quantum efficiency.

Also, plasma etching, which is normally used to groove the upper contact layer 121 and the upper layers B and W, often causes material damage underneath the grooves. As such, the damaged barrier layers B will become highly conductive, causing a number of well layers W to be shorted out. Since only the remaining undamaged layers B and W are still active, the sensitivity of the detector is reduced.

Partially absorbed IR radiation at one detector pixel may disadvantageously be directed into other detector pixels. As is generally well known, radiation within QWIP 120 can experience some internal refraction at the solid-air interfaces; total internal refraction can take place if the angle of incidence is larger than the critical angle. Radiation component R6 is seen in FIG. 4 being internally refracted at point P on the substrate-air interface. Because the angle of incidence I will in most cases be relatively large, a significant amount of radiation component R6 will be internally refracted while only a small portion or none will escape substrate 123. The internally refracted component R6 may be directed into stack S of the adjacent QWIP 120' as seen in FIG. 4. These internal refractions of the partially absorbed IR radiation can cause appreciable crosstalk between the different detector pixels.

Additionally, because the incident radiation, such as radiation R1, must have a narrow range of wavelengths to be diffracted to the proper angles for a given grating periodicity, this technique cannot be used to couple a wide range of radiation with different wavelengths and, hence, limits the detector spectral response. Also, grating coupling cannot be used effectively for multi-color detection.

Still further, because diffraction of light by grating contact 126 will be effective only when the grating dimension is much larger than the groove spacing, high resolution detector arrays using this technique may be difficult or impossible to achieve. In a high resolution detector array, the pixel dimension is very small and the grating spacing permits only a few grooves to be formed on each of QWIP's 120 and 120'. As such, the small number of grooves can reduce grating efficiency.

Figure 5:
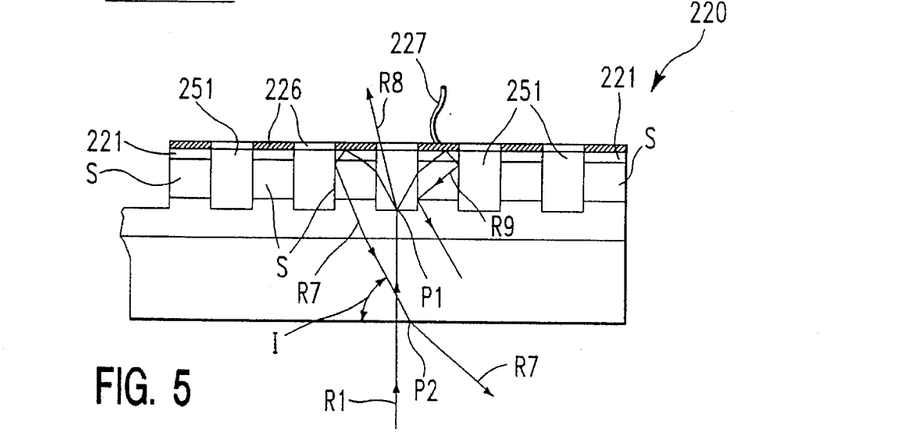
FIG. 5 is an enlarged schematic cross section in elevation, taken on the line 5—5 of FIG. 6 and looking in the direction of the arrows, of a preferred embodiment of a quantum grid infrared photodetector (QGIP) array in accordance with the present invention.
Figure 6:
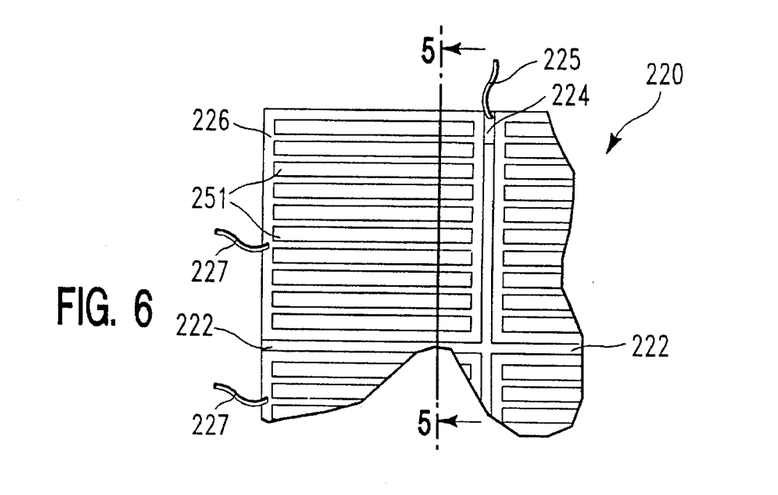
FIG. 6 is a top view of the photodetector array shown in FIG. 5.

FIGS. 5 and 6, which illustrate a preferred embodiment of the invention, show a quantum grid IR photodetector (QGIP) 220 formed from a QWIP structure, such as shown in FIG. 2, supported on transparent substrate 223 which supports lower contact layer 222. QGIP 220 further includes stack S of alternate semiconductor material barrier and well layers, such as layers B and W of FIG.2, sandwiched between lower contact layer 222 and upper contact layer 221. Metal contact 226, which is deposited on the surface of upper contact layer 221, connects to conductor 227. Metal contact 224, which is deposited on the upper surface of lower contact layer 222, connects to conductor 225.

FIG. 6 illustrates the top view of a portion of a two-dimensional array of QGIP's 220. Each QGIP 200 in the array connects to a different conductor 227 while all QGIP's 220 have a common contact layer 222 on which a single metal contact 224 and conductor 225 are mounted.

A grid pattern of spaced, rectangular cavities 251 arranged in parallel rows is etched into the upper surface and layers of QGIP 220. FIG. 5 shows cavities 251 as having straight side walls that extend perpendicularly through metal contact 226, upper contact layer 221 and all of the semiconductor layers of stack S down to the lower contact layer 222. Cavities 251 may be formed by various conventional plasma etching techniques that typically produce straight walls.

Figure 7:
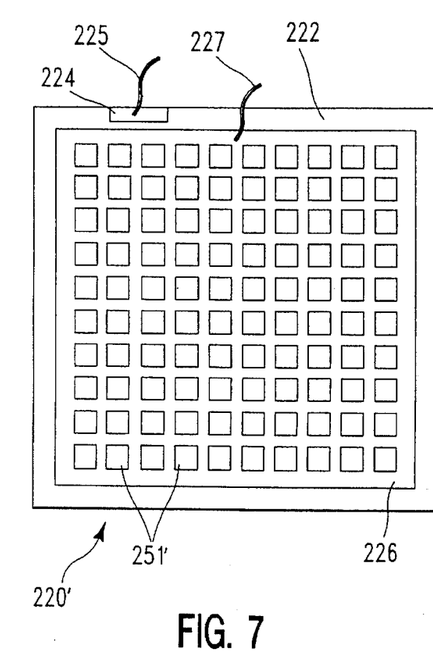
FIGS. 7 and 8 are top views, similar to the view in FIG. 6, of alternate embodiments of QGIP's in accordance with the present invention.
Figure 8:
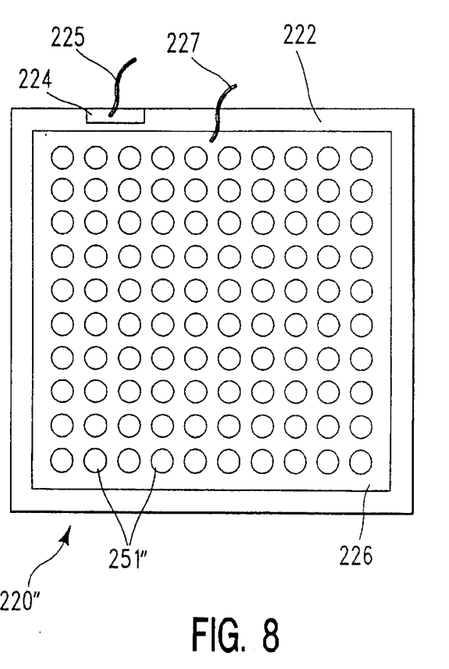

As seen in FIGS. 7 and 8, which are top views of alternate embodiments of the QGIP, the cavities may have various shapes. FIG. 7 shows QGIP 220' having a grid pattern of square cavities 251'. FIG. 8 shows QGIP 220" having a grid pattern of circular cavities 251" arranged in parallel rows and columns. It is noted that cross sectional views of QGIP 220' and QGIP 220" will display substantially the same configuration as seen in FIG. 5 for QGIP 220.

FIG. 5 shows IR radiation R1 propagating normal to the desired plane, i.e., the plane of well layers W, and entering cavity 251 at point P1. Cavities 251 are sized so that each one will function as an independent single-slit diffraction unit. Specifically, if the width of cavity 251 is in the order of a small number of wavelengths of IR radiation R1, single-slit diffraction of IR radiation R1 at cavity 251 will take place, causing IR radiation R1 to break up and bend into a continuum of radiation components, e.g., radiation components R7, R8 and R9, directed at different angles most of which will be significantly closer to the desired plane in which absorption takes place. It is assumed that normal incident radiation R1 lies in the plane of FIG. 5 and has a finite electric field component that also lies in the plane of FIG. 5. It is also assumed that the radiation components, e.g., radiation components R7, R8 and R9, produced by rectangular cavities 251, which have two fold symmetry, also lie in the plane of FIG. 5. For the embodiments shown in FIGS. 7 and 8, the polarization of the normal incident radiation R1 is not critical because it will be diffracted into other planes. For example, because square cavities 251' in FIG. 7 have four fold symmetry, normal incident radiation will be deflected into two planes. Consequently, normal incident radiation R1 of any polarization, i.e., having finite electric field components in either of two planes will be properly deflected by cavities 251'. Because circular cavities 251" in FIG. 8 have infinite fold symmetry, normal incident radiation will be deflected into an infinite number of planes. As such, normal incident radiation polarized in any direction will be properly diffracted by cavities 251".

FIG. 5 shows radiation component R8 being only slightly bent from the normal and, therefore, exits the upper end of cavity 251. As such, radiation component R8 will not be absorbed. However, cavity 251 diffracts component R7 into an angle which is much closer to the desired parallel plane. After diffraction, component R7 propagates in cavity 251 toward the side wall of stack S where, as it enters the solid material of stack S, it is refracted into an angle which is still closer to the desired parallel plane. After being partially absorbed by well layers W of stack S, component R7 is then reflected by metal contact 226 back into the layers of stack S where it is again partially absorbed. Next, a substantial portion of what remains of component R7 can be internally refracted by the solid-air interface at the walls of cavities 251. After component R7 leaves stack S it will normally encounter the substrate-air interface of substrate 223 at a relatively steep angle of incidence I as indicated at point P2 in FIG. 5. Because the angle of incidence I is normally small at point P2, only a small portion or none of component R7 will be internally refracted while a significant portion or all will leave substrate 223 as indicated in FIG. 5. Component R9 undergoes a similar series of diffractions, refractions and reflections as do most of the other radiation components that,, pass through the single-slit diffraction units formed by each of cavities 251.

On each new passage into one of the stacks S, the continuum of IR radiation components will undergo further absorption by well layers W. Because only a small portion or none of the IR radiation components will be internally refracted by the substrate-air interface, the amount of crosstalk between adjacent QGIP's of an array will normally be insignificant.

Figure 9:
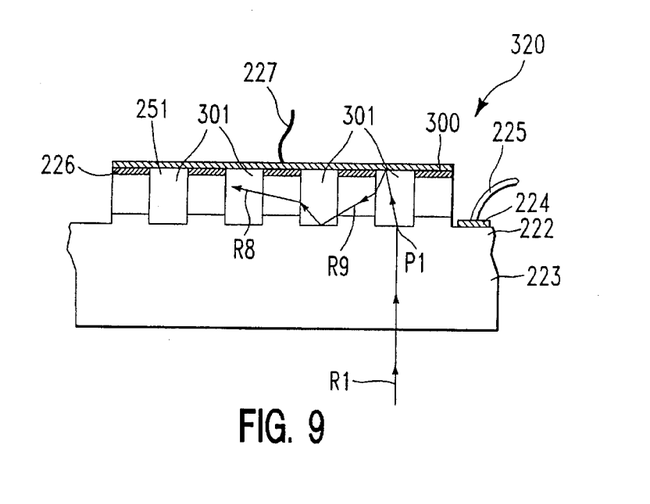
FIG. 9 is an enlarged schematic cross sectional view in elevation, similar to the view in FIG. 5, of another embodiment of a QGIP in accordance with the present invention.

In order to increase the IR radiation absorption in the present invention, a reflector can be added to prevent diffracted components, such as component R8 of FIGS. 5 and 9, from escaping the detector through the upper end of cavities 251. FIG. 9, which illustrates this feature, depicts cavities 251 filled with solid insulation 301 having a small refractive index so as to function much like air. Upper metal contact 226 and insulation 301 are plated with metals such as gold, to form metal contact 300 which connects to conductor 227. Metal contact 300 will reflect diffracted radiation components in cavities 251, such as component R8 of FIG. 9, back into the cavity. Much of this reflected radiation will De reflected toward one of the stacks S where it will be partially absorbed, thereby increasing the IR radiation absorption.

The IR radiation coupling mechanism of the present invention is significantly different from the conventional grating coupling technique described above with respect to FIG. 4. For grating coupling, the diffraction of the IR radiation depends on the coherent interference effect of all of the groves in the grating. On the other hand, in the single-slit technique, the deflection of the IR radiation into different directions depends only on the diffraction characteristics of each single-slit diffraction unit, i.e., diffraction does not depend on the number of cavities 251 but simply on the presence of each individual cavity 251. Because diffraction does not depend on the total QGIP area, QGIP's 220 can be made relatively small, e.g., in the order of 10 microns square.

QGIP devices using single-slit diffraction units, such as shown in QGIP's 220, 220', 220" and 320, can detect IR radiation over a much wider range of wavelengths then can prior art IR detectors, such as those depicted in FIGS. 2–4. Consequently, multicolor detection, i.e., IR radiation within two or more spectral regions, can be more readily achieved with such QGIP devices. The reason for this may be seen by considering the well established principal that for single-slit diffraction, radiation having wavelengths greater than about 1.4 times the width of the single-slit will be deflected through a range of angles of at least 45 degrees. As such, the diffracted radiation components in cavities 251, such as components R7 and R9 in FIG. 5, will contact the side walls of stacks S at angles of 45 degrees and greater. These components, e.g., components R7 and R9, as they enter stacks S will then be refracted toward the desired plane, i.e. the horizontal plane as viewed in FIG. 5. Consequently, these radiation components, which may have a wide range of wavelengths for a given cavity width (e.g., wavelengths greater than 1.4 times the width of cavities 251), will be propagating in stacks S in planes that will be very close to the desired plane of the well layers W in stacks S. On the other hand, only incident IR radiation in a narrow frequency band can be properly diffracted (radiation outside the band will be scattered or reflected) by a particular grating depending on its grating periodicity. Also, the diffracted components of a diffraction grating, e.g., components R3–R6 of FIG. 4, will be limited in number and will be oriented in only those few discrete directions where constructive interference effects takes place. In the present invention, the incident IR radiation is diffracted into a continuum of components directed at different angles.

Still further, the need to have the thick upper contact layer, as was required for contact layer 121 of FIG. 4, to construct QGIP's 220, 220', 220" and 320 is eliminated. Also, because the detector barrier layers B and well layers W of stacks S are totally removed to form cavities 251, there are no damaged detector layers formed which may short out other adjacent layers.

Additionally, the sensitivity of QGIP's made in accordance with the present invention can be greater than that for prior art QWIP's. For detectors using QGIP's, the optical area includes both the etched and un-etched areas (i.e., the areas of stacks S including cavities 251), while the detector area only includes the un-etched areas of stacks S. Because photocurrent is directly proportional to the optical area, and the dark current, which produces noise, is directly proportional to the detector area, detector sensitivity increases when the detector area is reduced without reducing the optical area, as is the case in the present invention.

Figure 10:
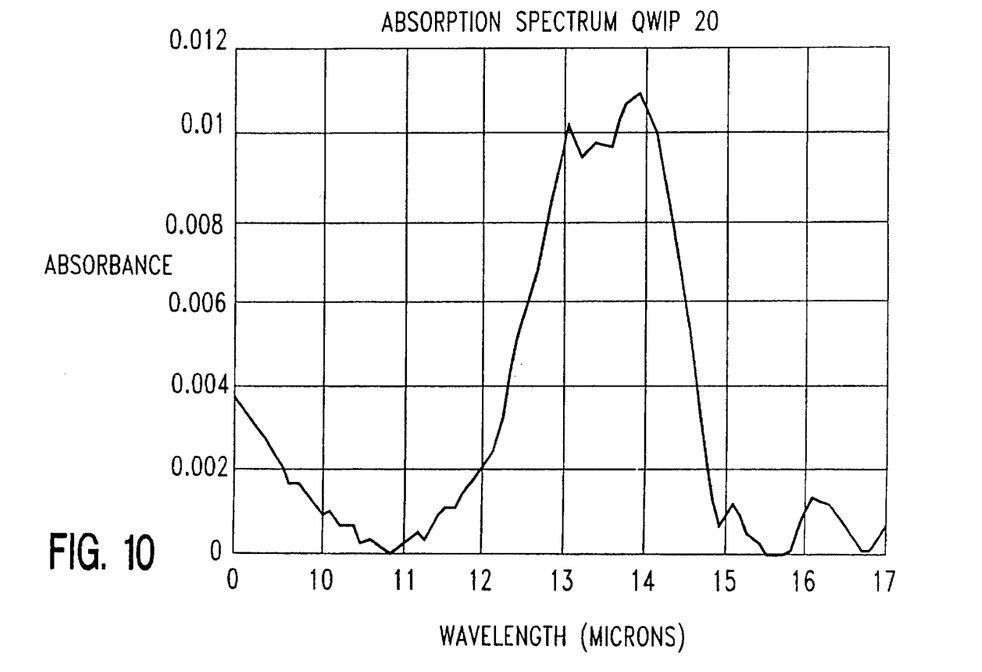
FIG. 10 is a graph showing the absorbance vs. wavelength for a QWIP semiconductor sample.
Figure 11:
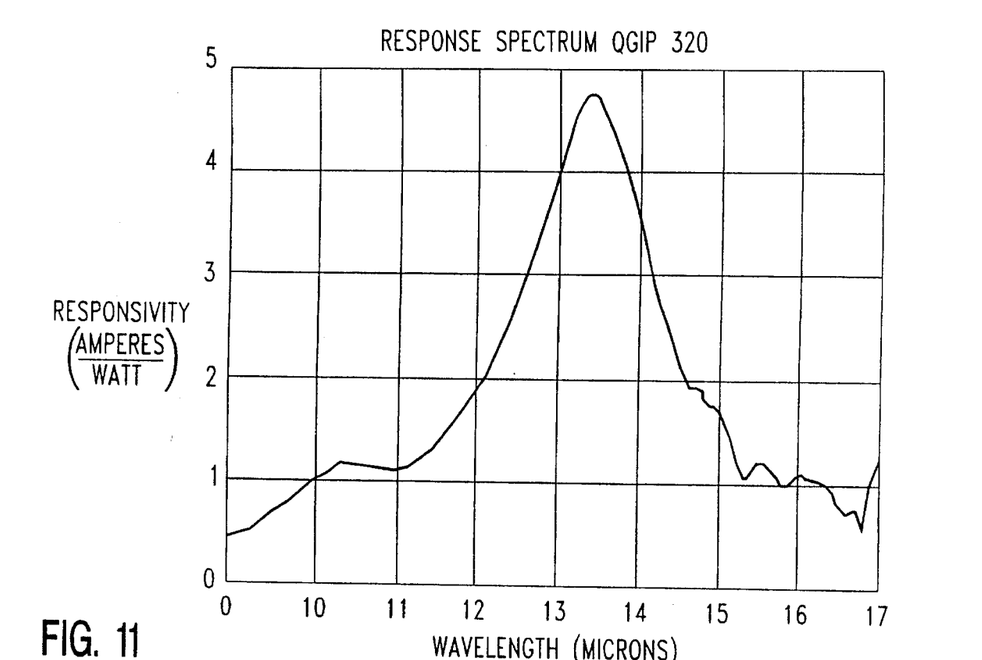
FIG. 11 is a graph showing the responsivity vs. wavelength for a QGIP made in accordance with FIGS. 6 and 9 of the present invention.

FIGS. 10 and 11 show experimental results which demonstrate the coupling efficiency of QGIP 320 of FIG. 9. The curve of FIG. 10 shows the optical absorption spectrum of a QWIP sample, such as QWIP 20 of FIG. 2, measured with a Fourier transform infrared spectrometer. The FIG. 10 curve was obtained by directing IR radiation into stack S of QWIP 20 at the Brewster's angle and measuring the amount of radiation absorbed by stack S over the range of frequencies indicated on the graph.

The curve of FIG. 11 shows the responsivity of QGIP 320 of FIG. 9 having a linear line pattern of rectangular cavities 251 arranged in parallel rows as shown in FIG. 6. For the sample QGIP 320 tested, the spacing between cavities 251 was 3.25 microns and the width of cavities 251 was 0.25 microns. The FIG. 11 curve was obtained by directing normal IR radiation into QGIP 320, i.e., in the direction of normal radiation R1 of FIG. 9, and measuring the amount of amperes of photocurrent generated between conductors 227 and 225 per watt of normal incident radiation R1. Because the curves of FIGS. 10 and 11 match relatively well across the frequency spectrum, it is evident that single-slit diffraction grid coupling is an efficient technique for coupling a broad band of radiation to a QWIP device.

Figure 12:
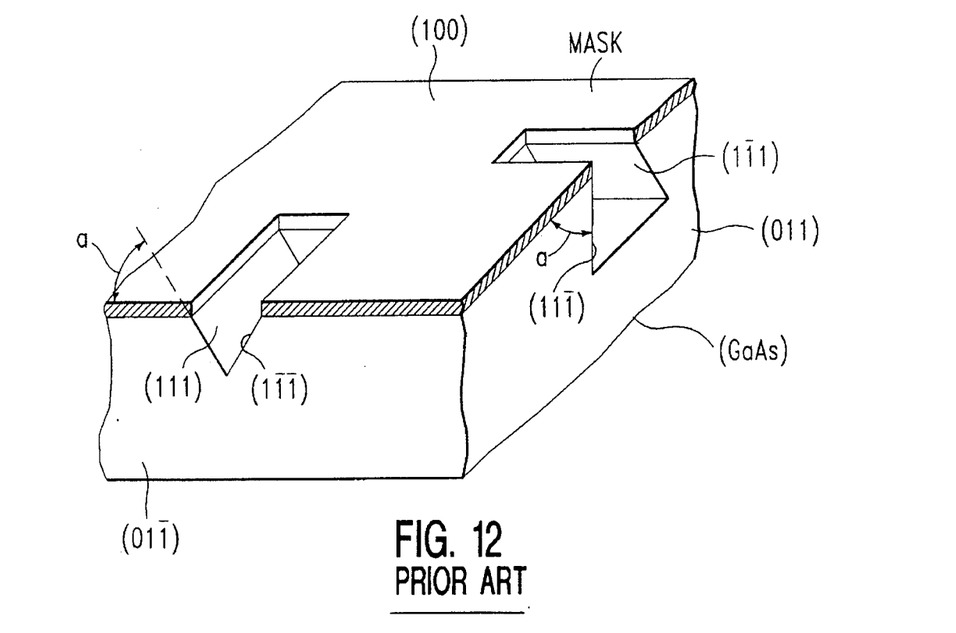
FIG. 12 is a pictorial view illustrating various crystallographic etching profiles that are obtained when the (100) face of GaAs is preferentially etched, which is useful in understanding the construction of the QGIP depicted in FIGS. 13 and 14.

Other modifications of the invention may be fabricated using chemical wet etching in place of plasma dry etching to form cavities having slanted sidewalls. FIG. 12 illustrates the basic groove profiles that can be obtained when mask openings in the (100) crystallographic face of a GaAs sample are used to preferentially wet etch the sample chemically with $H_2SO_4$—$H_2O_2$—$H_2O$. As can be seen from FIG. 12, a V-shaped groove can be formed along the (1$\bar{1}$1) and (1$\bar{1}\bar{1}$) crystallographic faces while an inverted V-shaped groove is formed between the (11$\bar{1}$) and (1$\bar{1}$1) crystallographic faces. The slanted walls of the grooves make an angle (a) of about 54.7 degrees with the (110) face. Consequently, by using chemical wet etching, cavities having slanted walls that form other than a perpendicular angle with respect to the plane of well layers W can be formed. An example of such a QGIP is illustrated in FIGS. 13–15.

Figure 13:
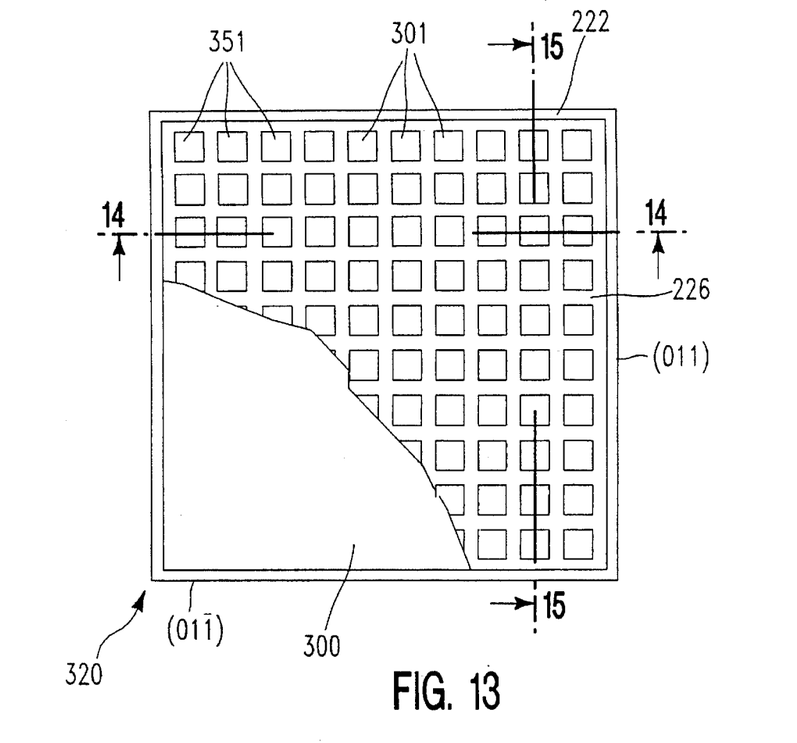
FIG. 13 is an enlarged schematic cross sectional view in elevation, similar to the view in FIG. 5, showing a portion of another alternate embodiment of a QGIP made in accordance with the present invention.

FIG. 13 depicts a top view of QGIP 320 showing upper metal contact 300 broken away to expose a grid pattern of square cavities 351 aligned in columns and rows that are parallel to the (011) and (01$\bar{1}$) faces, respectively. FIG. 14 shows a cross section of QGIP 320 taken on the line 14—14 of FIG. 13. FIG. 15 shows a cross section of QGIP 320 taken on the line 15—15 of FIG. 13. QGIP 320 includes substrate 223, lower contact layer 222, stacks S and metal contact 226. Using the technique illustrated in FIG. 12, cavities 351 are chemically etched in QGIP 320 to form the orthogonally oriented V-shaped and inverted V-shaped profiles shown in FIGS. 14 and 15. After cavities 351 are filled with insulation 301, metal contact 300 is deposited on the upper surfaces of insulation 301 and metal contact 226.

The grid pattern of cavities 351 of QGIP 320 couple normal IR incident radiation R1 using several techniques. When viewed from one direction, cavities 351 in stack S form single-slit diffraction units. However, when viewed from another direction, the cavity-stack interface form radiation refraction surfaces.

Figure 14:
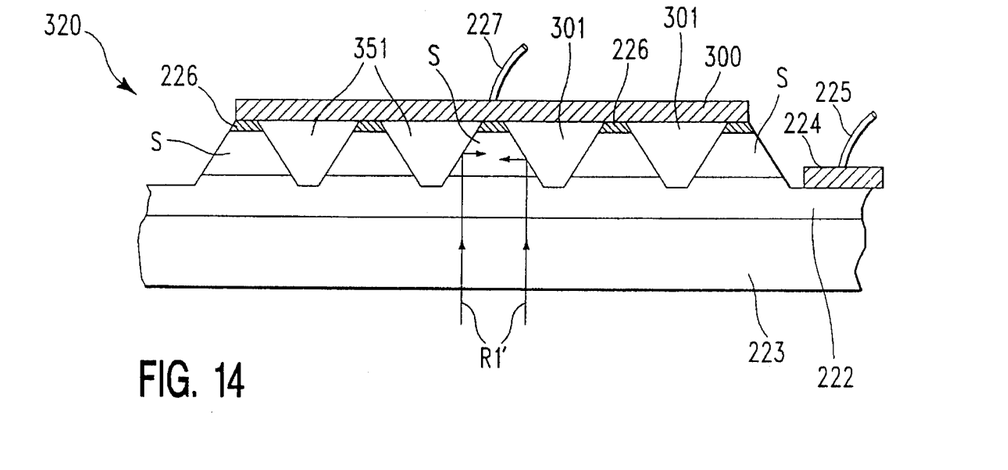
FIG. 14 is an enlarged schematic cross sectional view in elevation of the QGIP of FIG. 13 as seen from a direction perpendicular to that of FIG. 13.
Figure 15:
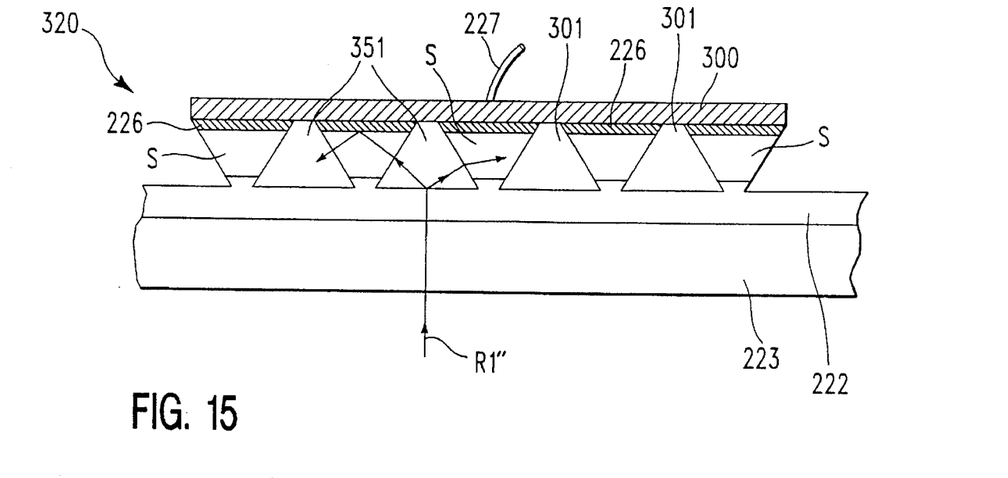
FIG. 15 is an enlarged schematic cross sectional view in elevation of the QGIP of FIG. 13 as seen from a direction parallel to that of FIG. 13.

More specifically, when viewed from the direction of FIG. 14, some of the normal radiation, designated as radiation R1', will enter stacks S directly through substrate 223 and layer 222 in a direction that is normal to the desired plane, i.e., the plane of well layers W. Radiation R1' will be totally refracted by the slanted interface between stack S and insulation 301 in cavity 351 into a direction that is very near the desired parallel plane of well layers W. Likewise, when viewed from the direction of FIG. 15, some of the normal radiation, designated as radiation R1", will also enter cavities 351 through substrate 223 and layer 222 normal to the desired plane. Radiation R1" will be single-slit diffracted upon entering cavities 351. Much of the diffracted radiation RI" will be directed toward the slanted walls of stacks S where it will be refracted into a direction that is nearer to the desired parallel plane of well layers W.

It should be understood that the foregoing disclosure relates to only preferred embodiments of the invention and that numerous other modifications or alterations may be made therein without departing from the spirit and the scope of the invention as set forth in the appended claims.

What is claimed is:

1. An infrared photodetector comprising:
   a transparent semiconductor substrate having a planar surface;
   a first contact layer formed on said planar surface;
   a quantum well infrared photodetector formed on said first contact layer and having a stack of alternate planar barrier layers and planar well layers with the planes of said barrier layers and said well layers being substantially parallel to said planar surface, said stack having a diffraction means formed therein such that the diffraction means has at least one cavity that extends through said stack to said first contact layer, wherein said cavity diffracts incident infrared radiation into a continuum of radiation components directed toward said well layers at different angles with respect to said planes of said well layers;
   a second contact layer formed on said quantum well infrared photodetector; and
   a metal plate deposited on said second contact layer.

2. The infrared photodetector of claim 1 wherein said diffraction means includes at least one single-slit diffraction unit formed in said stack.

3. The infrared photodetector of claim 2 wherein each said single-slit diffraction unit includes a cavity extending through said barrier layers, said well layers and said second contact layer.

4. The infrared photodetector of claim 3 further including a metal contact deposited on said first contact layer.

5. The infrared photodetector of claim 3 wherein said cavity has an elongated rectangular cross section in a plane parallel to said plane of said well layers and side walls that extend substantially perpendicular to said plane of said well layers.

6. The infrared photodetector of claim 3 wherein said cavity has a square cross section in a plane parallel to said plane of said well layers and side walls that extend substantially perpendicular to said plane of said well layers.

7. The infrared photodetector of claim 3 wherein said cavity has a round cross section in a plane parallel to said plane of said well layers and side walls that extend substantially perpendicular to said plane of said well layers.

8. The infrared photodetector of claim 3 wherein said cavity has a rectangular cross section in a plane parallel to said plane of said well layers and side walls that slant at an angle to said plane of said well layers.

9. The infrared photodetector of claim 8 wherein said cavity includes two pairs of opposed side walls and wherein one of said pairs has a V-shaped cross section and said other of said pairs has an inverted V-shaped cross section.

10. The infrared photodetector of claim 3 further including a solid insulator material positioned in said cavity and a metal surface mounted on said insulator material and covering said cavity, and wherein the refractive index of said insulator material is less than the refractive index of said stack.

11. A quantum grid infrared photodetector comprising:

a transparent semiconductor substrate having a planar surface;

a lower contact layer formed on said planar surface;

a quantum well infrared photodetector formed on said lower contact layer and having a stack of alternate planar barrier layers and planar well layers with the planes of said barrier layers and said well layers being substantially parallel to the plane of said planar surface, said stack having a diffraction means formed therein for diffracting incident infrared radiation into a continuum of radiation components directed toward said well layers at different angles with respect to said planes of said well layers, said diffraction means includes a plurality of single-slit diffraction units arranged as a grid in said stack such that at least one single-slit diffraction unit extends through said stack to said lower contact layer;

a upper contact layer formed on said quantum well infrared photodetector; and a metal plate deposited on said upper contact layer.

12. The quantum grid infrared photodetector of claim 11 further including a metal contact deposited on said lower contact layer, and wherein each said single-slit diffraction unit includes a cavity extending through said barrier layers, said well layers and said upper contact layer.

13. The quantum grid infrared photodetector of claim 12 wherein the cross sectional shape of each said cavity, in a plane parallel to said plane of said well layers, forms an elongated rectangle, and wherein said cavities are arranged in parallel rows to form said grid.

14. The quantum grid infrared photodetector of claim 12 wherein each said cavity has a square cross section in a plane parallel to said plane of said well layers, and wherein said cavities are arranged in parallel rows and columns to form said grid.

15. The quantum grid infrared photodetector of claim 12 wherein each said cavity has a round section in a plane parallel to said plane of said well layers, and wherein said cavities are arranged in parallel rows and columns to form said grid.

16. The quantum grid infrared photodetector of claim 12 wherein each said cavity has side walls that extend substantially perpendicular to said plane of said well layers.

17. The quantum grid infrared photodetector of claim 12 wherein each said cavity has side walls that slant at an angle to said plane of said well layers.

18. The quantum grid infrared photodetector of claim 17 wherein each said cavity includes two pairs of opposed side walls and wherein one of said pairs has a V-shaped cross section and said other of said pairs has an inverted V-shaped cross section.

19. The quantum grid infrared photodetector of claim 12 further including a solid insulator positioned in each said cavity and metal surfaces mounted on said insulator material and covering said cavity, and wherein the refractive index of said insulator material is less than the refractive index of said stack.

20. A quantum grid infrared photodetector comprising:

a transparent semiconductor substrate having a planar surface;

a lower contact layer formed on said planar surface;

a plurality of spaced, quantum well infrared photodetectors mounted in an array on said lower contact layer, each said quantum well infrared photodetector having a stack of alternate planar barrier layers and planar well layers, said quantum well infrared photodetectors mounted with the planes of said barrier layers and said well layers being substantially parallel to the plane of said planar surface, each said stack having a diffraction means formed therein for diffracting incident infrared radiation into a continuum of radiation components directed toward said well layers at different angles with respect to said planes of said well layers, said diffraction means including a plurality of single-slit diffraction units arranged as a grid in said stack such that at least one single-slit diffraction unit extends through said stack to said lower contact layer; and a plurality of upper metal contacts each covering a different one of said quantum well infrared photodetectors.

21. The quantum grid infrared photodetector array of claim 20 wherein each said single-slit diffraction unit includes a cavity extending through said barrier layers, said well layers and said upper contact layer.

22. The quantum grid infrared photodetector array of claim 21 further including solid insulator material positioned in each said cavity and a metal surface mounted on said insulator covering each said cavity, and wherein the refractive index of said insulator is less than the refractive index of said stack.

23. An infrared photodetector comprising:

a transparent semiconductor substrate having a planar surface;

a quantum well infrared photodetector optically coupled to said substrate, said quantum well infrared photodetector having a stack of alternate planar barrier layers and planar well layers, said stack having a diffraction means formed therein such that the diffraction means has at least one cavity that extends through said stack, wherein said cavity diffracts incident infrared radiation into a continuum of radiation components directed toward said well layers; and means to electrically bias the quantum well infrared photodetector.

* * * * *